(12) United States Patent
Adachi et al.

(10) Patent No.: US 10,477,699 B2
(45) Date of Patent: Nov. 12, 2019

(54) METHOD FOR MANUFACTURING ELECTRONIC COMPONENT ATTACHED WIRING BOARD

(71) Applicant: IBIDEN CO., LTD., Ogaki (JP)

(72) Inventors: Takema Adachi, Ogaki (JP); Masaaki Murase, Ogaki (JP); Takayuki Katsuno, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 268 days.

(21) Appl. No.: 15/447,705

(22) Filed: Mar. 2, 2017

(65) Prior Publication Data
US 2017/0257952 A1     Sep. 7, 2017

(30) Foreign Application Priority Data
Mar. 3, 2016  (JP) ................. 2016-041190

(51) Int. Cl.
| H05K 3/30 | (2006.01) |
| H05K 3/34 | (2006.01) |
| H05K 3/46 | (2006.01) |
| H05K 3/22 | (2006.01) |
| H05K 1/11 | (2006.01) |
| H05K 1/18 | (2006.01) |

(52) U.S. Cl.
CPC .......... *H05K 3/3452* (2013.01); *H05K 1/111* (2013.01); *H05K 1/181* (2013.01); *H05K 3/22* (2013.01); *H05K 3/4644* (2013.01)

(58) Field of Classification Search
CPC .......... H05K 1/111; H05K 1/181; H05K 3/22; H05K 3/3452; H05K 3/4644
See application file for complete search history.

(56) References Cited

U.S. PATENT DOCUMENTS

| 8,314,344 B2* | 11/2012 | Sakaguchi | H01L 21/563 174/260 |
| 9,603,238 B2* | 3/2017 | Takahashi | H05K 1/0271 |
| 10,004,145 B2* | 6/2018 | Ishihara | H05K 1/142 |
| 2001/0036684 A1* | 11/2001 | Kitade | H05K 3/3405 438/106 |

(Continued)

FOREIGN PATENT DOCUMENTS

JP    2012-209580 A    10/2012

*Primary Examiner* — Paul D Kim
(74) *Attorney, Agent, or Firm* — Oblon, McClelland, Maier & Neustadt, L.L.P.

(57) ABSTRACT

A method for manufacturing an electronic component attached board includes preparing a first support plate, forming aggregate wiring boards on the first plate such that the aggregate boards each including wiring board side by side are formed in connected state on surface of the first plate, separating the first plate from the aggregate boards, dividing the aggregate boards into individual aggregate boards each including the wiring boards, bonding a second support plate to surface of each individual aggregate board such that each individual aggregate board is bonded to surface of the second plate, mounting electronic components on the wiring boards on the second plate such that each wiring board has an electronic component thereon, dividing the wiring boards into individual wiring boards, and separating the second plate from the individual wiring board. The surface of the first plate has size larger than size of the surface of the second plate.

20 Claims, 9 Drawing Sheets

(56) References Cited

U.S. PATENT DOCUMENTS

| | | | |
|---|---|---|---|
| 2005/0074912 A1* | 4/2005 | Yamauchi | H01L 24/97 |
| | | | 438/26 |
| 2007/0258605 A1* | 11/2007 | Tsuchiya | H04R 31/00 |
| | | | 381/174 |
| 2008/0301935 A1* | 12/2008 | Iida | H05K 3/3478 |
| | | | 29/843 |
| 2015/0185137 A1* | 7/2015 | Amari | H01L 33/62 |
| | | | 356/237.1 |

* cited by examiner

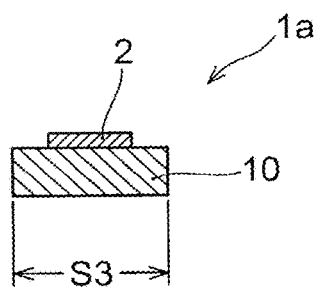
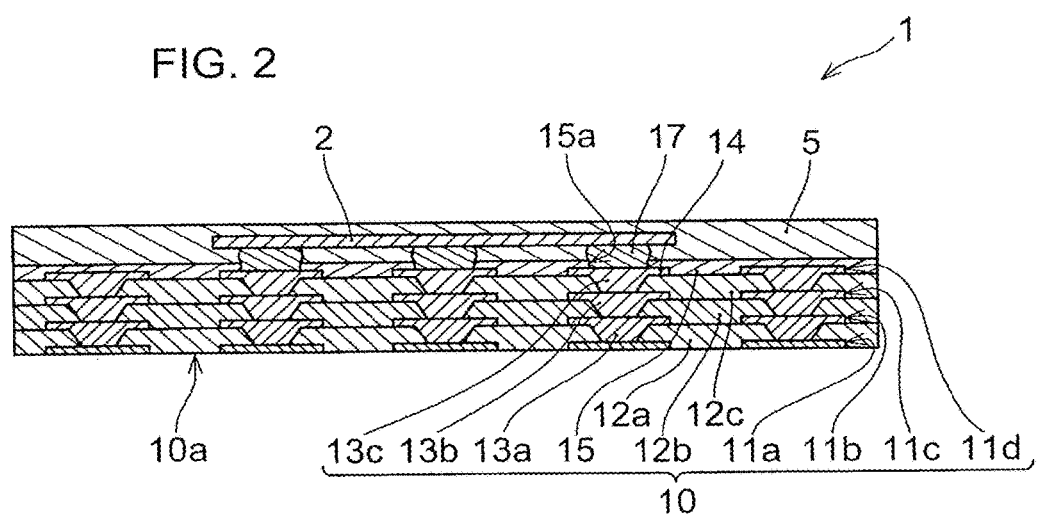

METHOD FOR MANUFACTURING ELECTRONIC COMPONENT ATTACHED WIRING BOARD

CROSS-REFERENCE TO RELATED APPLICATIONS

The present application is based upon and claims the benefit of priority to Japanese Patent Application No. 2016-041190, filed Mar. 3, 2016, the entire contents of which are incorporated herein by reference.

BACKGROUND OF THE INVENTION

Field of the Invention

The present invention relates to a method for manufacturing an electronic component attached wiring board that has a wiring board and an electronic component mounted on the wiring board.

Description of Background Art

Japanese Patent Laid-Open Publication No. 2012-209580 describes a method for manufacturing a semiconductor device in which a wiring substrate is formed on a support that is formed from a plate of metal such as copper, and a semiconductor element is mounted on the wiring substrate after the support is removed or on the wiring substrate on the support. The entire contents of this publication are incorporated herein by reference.

SUMMARY OF THE INVENTION

According to one aspect of the present invention, a method for manufacturing an electronic component attached wiring board includes preparing a first support plate, forming aggregate wiring boards on a surface of the first support plate such that the aggregate wiring boards each including wiring board side by side are formed in a connected state on the surface of the first support plate, separating the first support plate from the aggregate wiring boards in the connected state, dividing the aggregate wiring boards in the connected state into individual aggregate wiring boards each including the wiring boards, bonding a second support plate to a surface of each of the individual aggregate wiring boards such that each of the individual aggregate wiring boards is bonded to a surface of the second support plate, mounting electronic components on the wiring boards in each of the individual aggregate wiring boards on the second support plate respectively such that each of the wiring boards in each of the individual aggregate wiring boards has a respective one of the electronic components mounted thereon, dividing the wiring boards in each of the individual aggregate wiring boards into individual wiring boards, and separating the second support plate from the individual wiring boards. The surface of the first support plate has a first size which is larger than a second size of the surface of the second support plate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1F is a cross-sectional view along an IF-IF line in FIG. 1E;

FIG. 2 is a cross-sectional view illustrating an example of an electronic component attached wiring board manufactured using the manufacturing method of the embodiment of the present invention;

DETAILED DESCRIPTION OF THE EMBODIMENTS

Figure 1A:
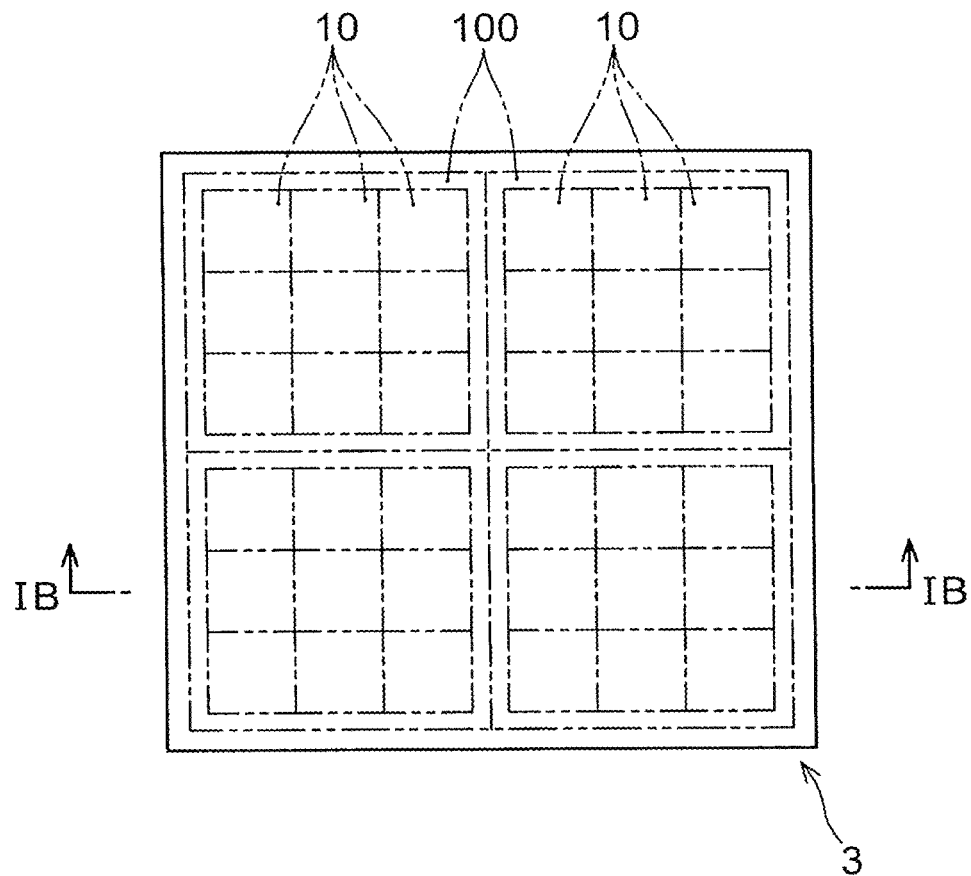
FIG. 1A is a plan view describing an outline of a manufacturing method of an embodiment of the present invention.

The embodiments will now be described with reference to the accompanying drawings, wherein like reference numerals designate corresponding or identical elements throughout the various drawings.

A method for manufacturing an electronic component attached wiring board according to an embodiment of the present invention is described. First, an outline of the embodiment is described with reference to FIGS. 1A-1F. In FIGS. 1A-1F, to facilitate understanding of the manufacturing method of the embodiment, dimensions of a wiring board 10 and the like are enlarged as appropriate in a thickness direction (up-down direction in the drawings) and in a surface direction (left-right direction in the drawings).

Figure 1B:
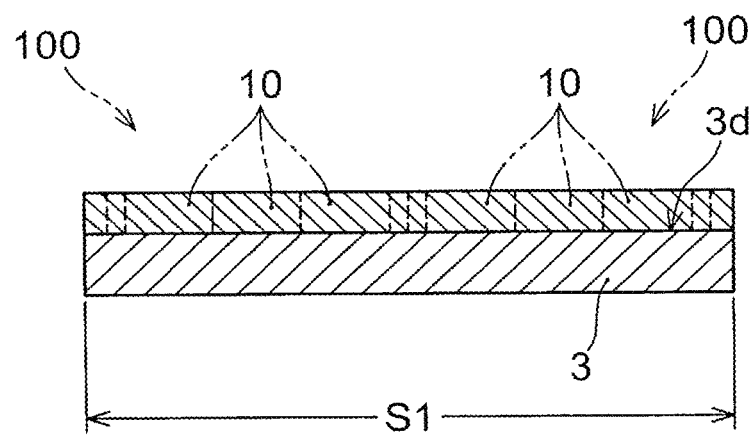
FIG. 1B is a cross-sectional view along an IB-IB line in FIG. 1A.

In the present embodiment, as illustrated in FIGS. 1A and 1B, a first support plate 3 is prepared having in a plan view a first size (S1) that is larger than that of the wiring board 10 that forms the electronic component attached wiring board. Multiple aggregate wiring boards 100 are formed in a connected state by forming a conductor layer and an insulating layer (which are not illustrated in the drawings) on a surface (3d) of the first support plate 3. The aggregate wiring boards 100 are each formed by multiple wiring boards 10 that are formed side by side. Then, the first support plate 3 is separated from the aggregate wiring boards 100. Along with the separation, or before or after the separation, the aggregate wiring boards 100 in the connected state are divided into individual aggregate wiring boards 100 (see FIG. 1C).

Figure 1C:
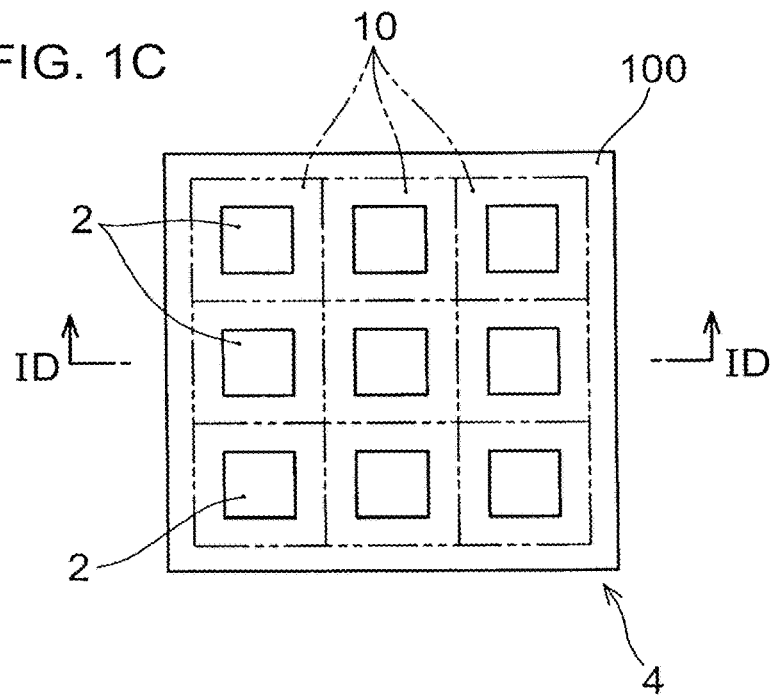
FIG. 1C is a plan view describing the outline of the manufacturing method of the embodiment of the present invention.
Figure 1D:
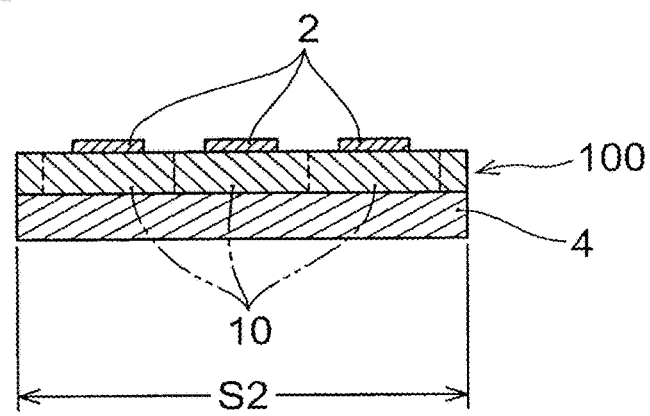
FIG. 1D is a cross-sectional view along an ID-ID line in FIG. 1C.
Figure 1E:
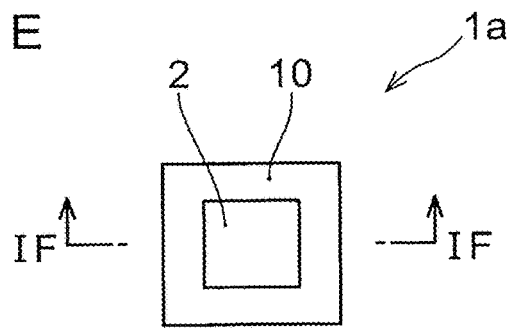
FIG. 1E is a plan view describing the outline of the manufacturing method of the embodiment of the present invention.

As illustrated in FIGS. 1C and 1D, a second support plate 4 is bonded to a surface on one side of an individually divided aggregate wiring board 100. Then, on the second support plate 4, an electronic component 2 is mounted on each of the multiple wiring boards 10 in the aggregate wiring board 100. The second support plate 4 has in a plan view a second size (S2) that is larger than that of each of the wiring boards 10 and smaller than the first size (S1) (see FIG. 1) Then, as illustrated in FIGS. 1E and 1F, the multiple wiring boards 10 in the aggregate wiring board 100 are divided into individual wiring boards 10. Along with the division of the multiple wiring boards 10, or before or after the division of the multiple wiring boards 10, the second support plate 4 is separated from the wiring boards 10. Each wiring board 10 has in a plan view a third size (S3) that is substantially the same as a size, in a plan view, of an outer shape of an electronic component attached wiring board (1a).

That is, according to the method for manufacturing the electronic component attached wiring board of the embodiment, after the formation of the multiple wiring boards 10 on the first support plate 3, the first support plate 3 is separated from the wiring boards 10. Then, the second support plate 4 is bonded to the aggregate wiring board 100 before the electronic components 2 are mounted. The electronic components 2 are respectively mounted on the wiring boards 10 on the second support plate 4. For the second support plate 4, an appropriately rigid material such as a resin substrate formed of prepreg, or a metal plate, or the like, can be used. Since each wiring board 10 is supported by the rigid second support plate 4, warpage or deflection of each electronic component 2 during mounting is less likely to occur. Mounting yield of the electronic component 2 is expected to be high. The electronic component 2 and the wiring board 10 are reliably connected to each other. Reliability of the connection between the electronic component 2 and the wiring board 10 is expected to be high.

The second support plate 4 has the second size (S2) that is smaller than the size (first size (S1)) of the first support plate 3. Further, before the electronic components 2 are mounted, the aggregate wiring boards 100 in the connected state are divided into individual aggregate wiring boards 100. Therefore, as compared to a case where the electronic components 2 are mounted on the wiring boards 10 in the aggregate wiring boards 100 in the connected state on the first support plate 3, the manufacturing method of the present embodiment does not require large mounting equipment. Since an array range for the electronic components 2 is small, component arraying accuracy of the mounting equipment can be easily improved. Also from this point of view, the mounting yield of the electronic components 2 is likely to be high, and the reliability of the connection between the electronic component 2 and the wiring board 10 is likely to be high.

The term "plan view" relates to a way of viewing plate-like objects such as the wiring board 10 and the first and second support plates 3, 4 from outside, and means that a plate-like object is viewed along a thickness direction of the plate-like object. The terms "large in a plan view" means that, in a plan view, for example, among two plate-like objects, a first plate-like object has an area larger than that of a second plate-like object and a contour of the second plate-like object entirely fits within a contour of the first plate-like object.

The wiring boards 10 are formed on the first support plate 3 that has in a plan view the first size (S1) that is larger than the size (third size (S3)) of each of the wiring boards 10. Multiple wiring boards 10 can be simultaneously formed as an aggregate wiring board 100 on the first support plate 3. In addition, multiple aggregate wiring boards 100 can be formed in a connected state, that is, can be formed simultaneously. Therefore, a large number of wiring boards 10 can be simultaneously formed. The wiring boards 10 can be manufactured with high efficiency. Also for the first support plate 3, an appropriately rigid resin substrate, or a metal plate, or the like, can be used. Since each wiring board 10 is supported by the first support plate 3 during a manufacturing process, a conductor layer (11a) (see FIG. 2) and the like that form the wiring board 10 can be easily formed with accurate wiring width and gap width with respect to designed dimensions. Good quality wiring boards 10 can be manufactured.

That is, according to the manufacturing method of the embodiment, both the formation of the multiple wiring boards 10 and the mounting of the multiple electronic components 2 to the respective wiring boards 10 are respectively simultaneously performed on appropriately sized support plates. In addition, the formation of the wiring boards 10 and the mounting of the electronic components 2 are performed with high yield, high accuracy and good quality, Highly reliable electronic component attached wiring boards can be manufactured in a short time period in large quantity at a low cost.

In FIGS. 1B, 1D and 1F and in FIGS. 3A and 3H (to be described later), the reference numeral symbols "S1"-"S3" are each described as indicating a length of one side of the rectangular first support plate 3, second support plate 4 or wiring board 10. However, the reference numeral symbols "S1"-"S3" in the drawings are each only described as indicating a length of one side of the first support plate 3, the second support plate 4 or the wiring board 10, as an example of an element that specifies a size of the first support plate 3, the second support plate 4 or the wiring board 10. That is, the first-third sizes (S1-S3) are each not limited to a length of one side of the first support plate 3, the second support plate 4 or the wiring board 10, but can each mean a certain geometric quantity that can define a "size" of the first support plate 3, the second support plate 4 or the wiring board 10. The "size" is compared based the definition of the above-described term "large in a plan view". For example, a length of a specific portion or an entire length of an outer periphery, or an area of a specific region or an entire area, or the like, of the first support plate 3, the second support plate 4 or the wiring board 10 can be the geometric quantity that is meant by the first size (S1), the second size (S2) or the third size (S3).

FIG. 2 illustrates an electronic component attached wiring board 1 as an example of a result obtained by using the manufacturing method of the embodiment. The electronic component attached wiring board 1 has a wiring board 10 and an electronic component 2 mounted on the wiring board 10, the wiring board 10 having conductor layers (11*a*-11*d*) and resin insulating layers (12*a*-12*c*). The surface-layer conductor layer (11*d*) of the wiring board 10 includes connection pads 14 for connecting to the electronic component 2. The electronic component 2 is connected to the connection pads 14 by bonding members 17. Via conductors (13*a*-13*c*) are respectively formed in the resin insulating layers (12*a*-12*c*). Due to the via conductors (13*a*-13*c*), conductor layers on both sides of each of the resin insulating layers are connected to each other.

In the example of FIG. 2, the wiring board 10 further has a solder resist layer 15 on the conductor layer (11*d*) and the resin insulating layer (12*c*). The solder resist layer 15 has openings (15*a*) on the connection pads 14, and the electronic component 2 is connected to the connection pads 14 that are respectively exposed in the openings (15*a*). The electronic component 2 is covered by a sealing member 5 that is formed on the solder resist layer 15. One surface of the conductor layer (11*a*) is exposed on a first surface (10*a*) of the wiring board 10.

Using the electronic component attached wiring board 1 illustrated in FIG. 2 as an example, an example of the method for manufacturing an electronic component attached wiring board of the embodiment is further described in detail with reference to FIGS. 3A-3K.

Figure 3A:
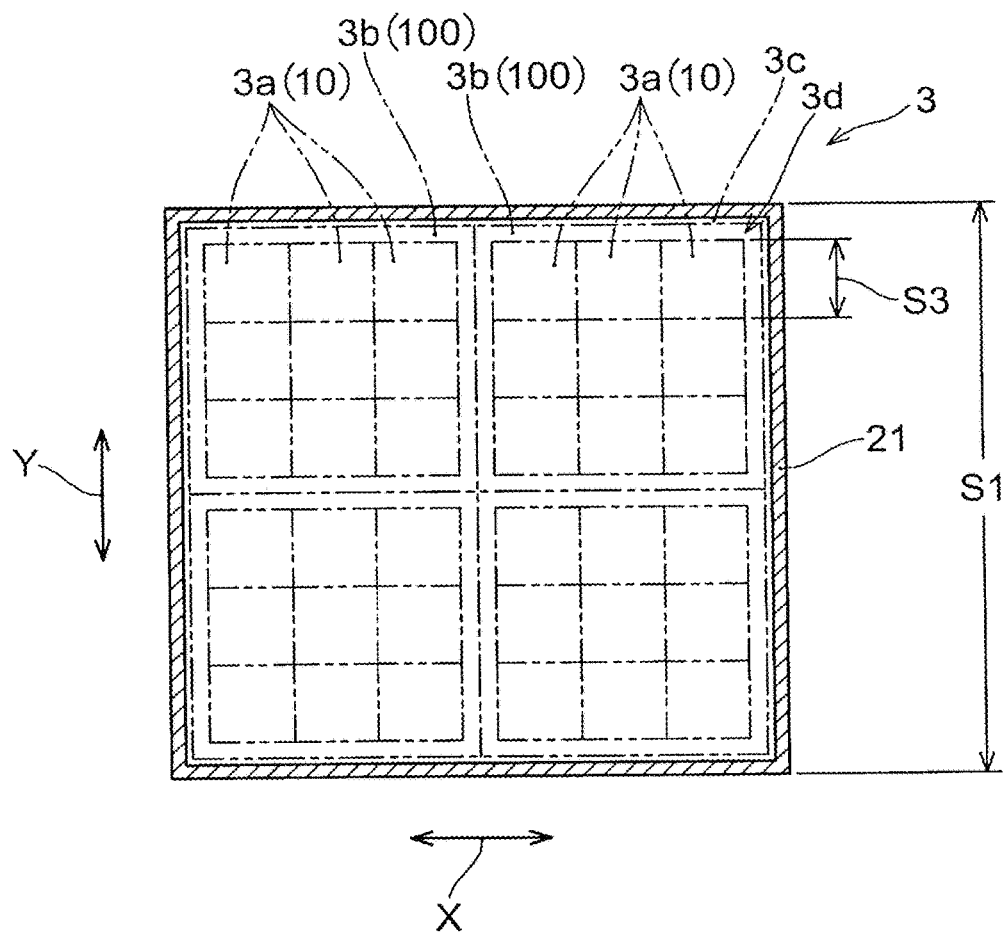
FIG. 3A is a plan view illustrating an example of the manufacturing method of the embodiment of the present invention.

As illustrated in FIG. 3A, the first support plate 3 is prepared. For example, a resin substrate obtained by curing a prepreg that contains a reinforcing material such as glass fiber, or a metal plate formed of copper or the like, is prepared as the first support plate 3. Further, it is also possible that a double-sided copper-clad laminated plate obtained by thermocompression bonding a copper foil on both sides of a prepreg is used as the first support plate 3. A material for the first support plate 3 is not limited to these materials, and any material can be used as long as the material is rigid enough to allow the wiring boards 10 to be stably formed on the first support plate 3 (see FIG. 1A). Any appropriately rigid material can be used for the first support plate 3.

The first support plate 3 has in a plan view the first size (S1) that is larger than the size (third size (S3)) of each of the wiring boards 10. In FIG. 3A, multiple formation regions (3*a*) for wiring boards 10 and multiple formation regions (3*b*) for aggregate wiring boards 100 are indicated using two-dot chain lines, the formation regions (3*b*) each including multiple formation regions (3*a*) (for clarity, the reference numeral symbols "10" and "100" are respectively added in parentheses after the reference numeral symbols "3*a*" and "3*b*"). FIG. 3A illustrates an example in which a total of 36 wiring boards 10 are formed, six along each of one side of an outer periphery of the first support plate 3 (for example, a side along an X direction indicated by a reference numeral symbol "X") and another side orthogonal to the one side (for example, a side along a Y direction indicated by a reference numeral symbol "Y"). Further, FIG. 3A illustrates an example in which each of the aggregate wiring boards 100 is formed to include 9 wiring boards 10 by arraying three wiring boards 10 side by side along each of the X direction and the Y direction. In the example of FIG. 3A, a total of 4 aggregate wiring boards 100, two in each of the X direction and the Y direction, are formed in a connected state on the first support plate 3.

The number of the wiring boards 10 and the number of the aggregate wiring boards 100 formed on the first support plate 3 are not limited to those of the example of FIG. 3A. Further, the number of the wiring boards 10 and the number of the aggregate wiring boards 100 formed along each side of the first support plate 3 that has, for example, a rectangular outer peripheral shape are also not limited to those of the example of FIG. 3A. Similarly, the number of the wiring boards 10 that form each of the aggregate wiring boards 100 and the number of the wiring boards 10 that are formed along one side of each of the aggregate wiring boards 100 are also not limited to those of the example of FIG. 3A. In the present embodiment, multiple aggregate wiring boards 100 in a connected state are formed on the first support plate 3, each of the aggregate wiring boards 100 being formed to include multiple wiring boards 10. Therefore, at least four wiring boards 10, and at least two aggregate wiring boards 100, are formed on the first support plate 3.

Preferably, a first support plate 3 having a size equal to or larger than a total size of the multiple aggregate boards 100 that are formed in a connected state is used. For example, it is possible that multiple wiring boards 10 each having a rectangular outer shape in a plan view are aligned in orientation and are formed in an array shape on a first support plate 3 having a rectangular outer shape in a plan view. In this case, an X direction side of the first support plate 3 preferably has a length equal to or larger than a total length of X direction sides of multiple wiring boards 10 formed along the X direction. Similarly, a Y direction side of the first support plate 3 preferably has a length equal to or larger than a total length of Y direction sides of multiple wiring boards 10 formed along the Y direction. All the wiring boards 10 can be stably formed on the first support plate 3.

In the example of FIG. 3A, the first support plate 3 has a substantially square outer peripheral shape in a plan view. The outer peripheral shape of the first support plate 3 in a plan view is not limited to the square shape illustrated in FIG. 3A, but it may also be, for example, a rectangular or circular shape. Depending on a planar shape of the electronic component attached wiring board 1, a first support plate 3 of any shape can be used.

In addition to the formation regions (3*b*) for the aggregate wiring boards 100, the first support plate 3 has a margin region (3*c*) between an outer edge of all the formation regions (3*b*) for the multiple aggregate wiring boards 100 and an edge of the first support plate 3. The first support plate 3 has the first size (S1) that includes sizes of the formation regions (3*b*) for the multiple aggregate wiring boards 100 and a size of the margin region (3*c*).

In the manufacturing method of the embodiment, it is also possible that a metal foil 22 (see FIG. 3B) is provided on the surface (3*d*) of the first support plate 3 before the formation of the aggregate wiring boards 100 on the surface (3*d*) of the first support plate 3. The metal foil may facilitate formation of the aggregate wiring boards 100 and subsequent separation of the first support plate 3 and the aggregate wiring boards 100. The metal foil 22 is provided on the surface (3d) of the first support plate 3 by bonding, for example, a copper foil or the like using an adhesive or the like. For example, as illustrated in FIG. 3A, an adhesive 21 is applied in a frame shape by printing or the like in a peripheral edge portion on the surface (3d) of the first support plate 3 (in FIG. 3A, to facilitate understanding of the application shape of the adhesive 21, the adhesive 21 is hatched). It is also possible that a film-like adhesive 21 formed into a frame shape is placed in the peripheral edge portion on the surface (3d) of the first support plate 3. The metal foil 22 is overlaid on the adhesive 21 and is bonded by the adhesive 21.

Figure 3B:
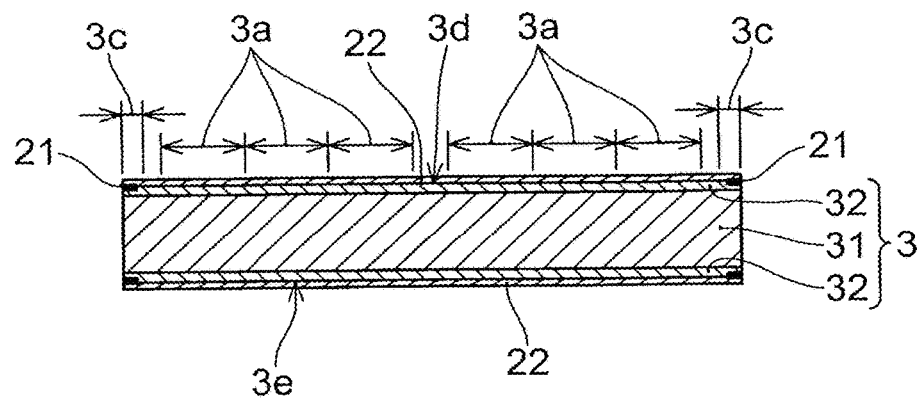
FIG. 3B is a cross-sectional view illustrating the example of the manufacturing method of the embodiment of the present invention.

FIG. 3B illustrates the first support plate 3 in the state in which the metal foil 22 is bonded. FIGS. 3B-3K illustrate cross-sectional views of the electronic component attached wiring board 1 during manufacturing processes. In FIGS. 3B-3K, in order to clearly illustrate the structure of the electronic component attached wiring board 1 during manufacturing processes, dimensions of the first support plate 3, the wiring board 10, and the like are enlarged as appropriate in the thickness direction (up-down direction in the drawings) and the surface direction (left-right direction in the drawings). The adhesive 21 is cured by heating, ultraviolet irradiation, room temperature storage for a predetermined time period, or the like, and as a result, the first support plate 3 and the metal foil 22 are bonded to each other.

FIG. 3B illustrates an example in which a double-sided copper-clad laminated plate obtained by bonding a copper foil 32 to both sides of base substrate 31 formed by curing a prepreg or the like is used as the first support plate 3. The metal foil 22 is also bonded to the other surface (3e) on an opposite side of the surface (3d) of the first support plate 3. That is, wiring boards 10 (see FIG. 1E) can be simultaneously formed on both the surface (3d) and the other surface (3e) of the first support plate 3. The wiring boards 10 can be efficiently manufactured. In FIGS. 3C-3F and the following description, illustration and description with respect to the other surface (3e) side of the first support plate 3 are omitted.

In the above-described example illustrated in FIGS. 3A, and 3B, the metal foil 22 is bonded only to an outer peripheral portion of the first support plate 3. In particular, the adhesive 21 is applied or placed only in the margin region (3c) of the first support plate 3, and the metal foil 22 is bonded only to the margin region (3c) of the first support plate 3. As will be described later, separation of the first support plate 3 from the aggregate boards 100 (see FIG. 1C) may be facilitated. Different from the example of FIGS. 3A and 3B, it is also possible that the adhesive 21 is supplied to the entire surface (3d) of the first support plate 3, and the metal foil 22 and the first support plate 3 are bonded to each other on their entire opposing surfaces. Since the metal foil 22 and the first support plate 3 are firmed bonded to each other, the wiring boards 10 can be more stably formed.

As described above, the metal foil 22 may facilitate the formation of the aggregate wiring boards 100 and the separation of the first support plate 3 from the aggregate wiring boards 100. For example, by using the metal foil 22 as a seed layer, the conductor layer (11a) (see FIG. 3C) of the aggregate wiring boards 100 can be easily formed in a short time period by electrolytic plating. Further, by peeling the first support plate 3 from the metal foil 22 at the bonding portion with the metal foil 22, the first support plate 3 can be easily separated from the aggregate wiring boards 100. The metal foil 22 is not necessarily required to be provided. For example, the conductor layer (11a) can be directly formed on the first support plate by electroless plating alone. Further, by removing a first support plate formed from a relatively thin metal plate by etching, or by removing a first support plate formed from a resin substrate by polishing, the first support plate can also be separated from the aggregate wiring boards.

The metal foil 22 is not limited to a copper foil as long as the metal foil 22 is capable of achieving the above-described functions. For example, it is also possible that a nickel foil is used. The metal foil 22 has a thickness of, for example, 3 µm or more and 10 µm or less. The metal foil 22 functions as a seed layer having a sufficiently low electrical resistance when the conductor layer (11a) is formed. Further, the metal foil 22 can be removed in a short time period by etching or the like. The adhesive 21 is not particularly limited as long as the adhesive 21 is capable of maintaining a bonding state between the metal foil 22 and the first support plate 3 without causing excessive misalignment or peeling between the metal foil 22 and the first support plate 3 during the formation of the wiring boards 10. As a type of a bonding mechanism, a thermosetting, ultraviolet curable, or room temperature curable adhesive may be used. A thermoplastic adhesive that facilitates separation of the first support plate 3 from the aggregate boards 100 may be used.

Figure 3C:
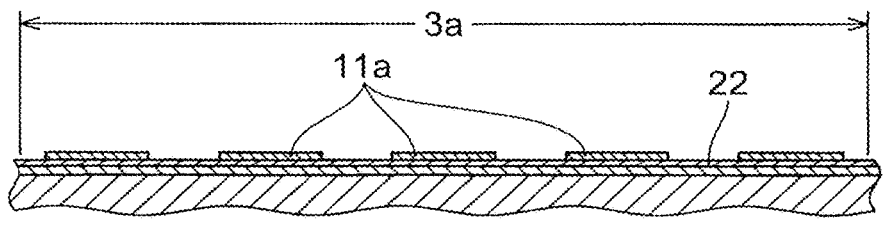
FIG. 3C is a cross-sectional view illustrating the example of the manufacturing method of the embodiment of the present invention.

As illustrated in FIG. 3C, the conductor layer (11a) that forms the wiring board 10 is formed on the metal foil 22. In FIG. 3C and in later-described FIG. 3D, of the first support plate 3, only a portion around a formation region (3a) for one wiring board is illustrated by being enlarged in the surface direction. The conductor layer (11a) is formed to have a predetermined conductor pattern. The conductor layer (11a) is formed, for example, by electrolytic plating using a plating resist having an opening at a formation region of a predetermined conductor pattern. The metal foil 22 can be used as a seed layer. The conductor layer (11a) can be formed in a relatively short time period. Further, since etching is not used, the conductor layer (11a) can be formed at a fine pitch. However, the method for forming the conductor layer (11a) is not limited to electrolytic plating. For example, as described above, when the metal foil 22 is not provided, the conductor layer (11a) may be formed by electroless plating or the like. A material of the conductor layer (11a) is not particularly limited as long as the material has good conductivity. Examples of the material of the conductor layer (11a) include copper, nickel and the like. Preferably, the conductor layer (11a) is formed of copper.

Figure 3D:
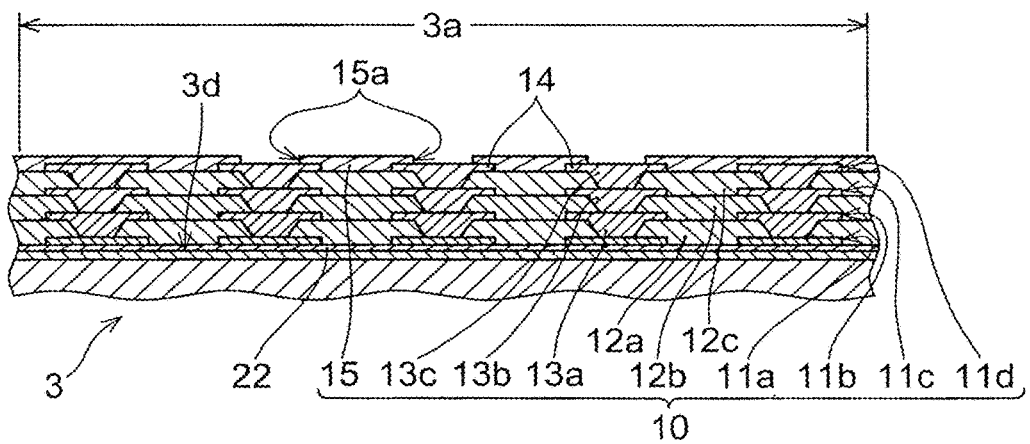
FIG. 3D is a cross-sectional view illustrating the example of the manufacturing method of the embodiment of the present invention.

As illustrated in FIG. 3D, on the conductor layer (11a), and on the metal foil 22 exposed without being covered by the conductor layer (11a), the resin insulating layer (12a), the conductor layer (11b), the resin insulating layer (12b), the conductor layer (11c), the resin insulating layer (12c), and the conductor layer (11d) are formed in this order. The conductor layers (11b-11d) are each formed to have a predetermined conductor pattern. Among the conductor layers (11a-11d), the uppermost conductor layer (11d) is formed to have the connection pads 14 for connecting to the electronic component 2 (see FIG. 2). Further, in the resin insulating layers (12a-12c), the via conductors (13a-13c) are respectively formed that connect the conductor layers on both sides of each of the resin insulating layers.

The resin insulating layers (12a-12c), the conductor layers (11b-11d) and the via conductors (13a-13c) can be formed, for example, using a method same as a method for manufacturing a build-up wiring board. For example, the resin insulating layer (12a) is formed by thermocompression bonding a film-like epoxy resin or the like on the conductor layer (11a) and an exposed portion of the metal foil 22. It is also possible that a metal foil such as a copper foil is laminated on the film-like epoxy resin and is thermocompression bonded together with the epoxy resin. Via holes are formed in the resin insulating layer (11*a*) by laser irradiation or the like. The conductor layer (11*b*) and the via conductors (13*a*) are formed by forming a seed metal film by electroless plating or sputtering or the like and by forming an electrolytic plating film by pattern plating. The seed metal film and an unwanted portion of the metal foil below the seed metal film are removed by etching. Then, the resin insulating layer (12*b*), the conductor layer (11*c*) and the via conductors (13*b*) are respectively formed using the same methods for forming the resin insulating layer (12*a*), the conductor layer (11*b*) and the via conductors (13*a*). Further, by repeating the same methods, the resin insulating layer (12*c*), the conductor layer (11*d*) and the via conductors (13*c*) are formed. It is also possible that the conductor layers (11*b*-11*d*) are formed by panel plating and patterning using a tenting method after the formation of the seed metal film.

Materials for the conductor layers (11*b*-11*c*) and the via conductors (13*a*-13*c*) are not particularly limited as long as the materials have good conductivity and allow the conductor layers (11*b*-11*c*) and the via conductors (13*a*-13*e*) to be easily formed by plating and can be easily removed by etching. Preferably, the conductor layers and the via conductors are formed of copper. Further, materials for the resin insulating layers (12*a*-12*c*) are not particularly limited as long as the materials have good insulation properties, good adhesion to conductor layers, and moderate thermal expansion coefficients. Preferably, the resin insulating layers (12*a*-12*c*) are formed of epoxy resin. The resin insulating layers (12*a*-12*e*) may each contain a inorganic filler such as silica.

The solder resist layer 15 that has the openings (15*a*) on the connection pads 14 is formed on the conductor layer (11*d*) and on a surface of the resin insulating layer (12*c*) exposed from the conductor layer (11*d*). For example, a layer of a photosensitive epoxy resin is formed on the conductor layer (11*d*) and on the resin insulating layer (12*c*) by printing, spray coating or the like, and the openings (15*a*) are formed using a photolithography technology. As illustrated in FIG. 3D, the wiring board 10 is formed on the surface (3*d*) of the first support plate 3 by alternately laminating the conductor layers and the resin insulating layers.

Figure 3E:
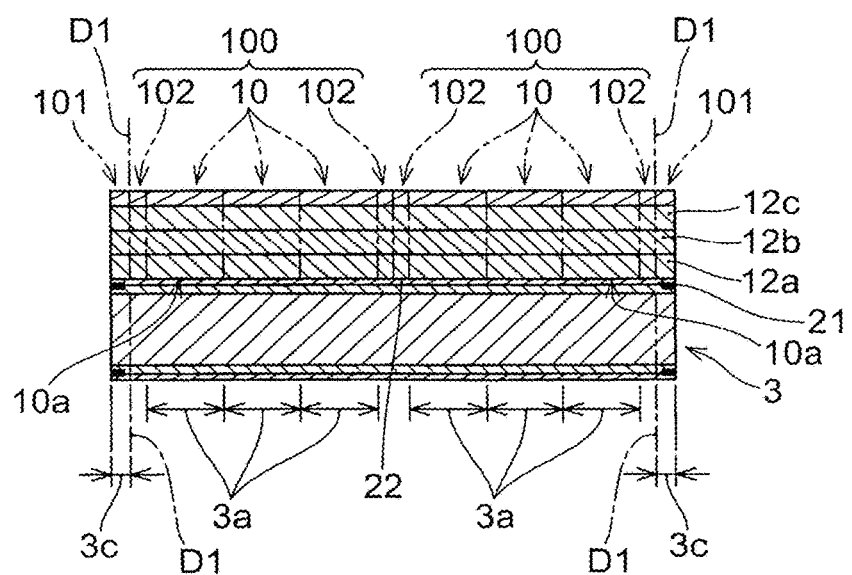
FIG. 3E is a cross-sectional view illustrating the example of the manufacturing method of the embodiment of the present invention.

The cross section of the entire first support plate 3 after the formation of the wiring boards 10 is illustrated in FIG. 3E at substantially the same magnifications in the thickness direction and the surface direction as in FIG. 3B. Further, illustration of the conductor layers (11*a*-11*d*) and the via conductors (13*a*-13*e*) is omitted (illustration of the conductor layers (11*a*-11*d*) and the via conductors (13*a*-13*c*) is also omitted in later-described FIGS. 3F-3H, 3J and 3K).

As illustrated in FIG. 3E, the multiple wiring boards 10 are formed side by side adjacent to each other. Multiple (two in the left-right direction on the drawing in the example of FIG. 3E) aggregate wiring boards 100 are formed in a connected state by these multiple wiring boards 10. Each aggregate wiring board 100 has a dummy area 102 that surrounds multiple wiring boards 10 of the aggregate wiring board 100. Dummy areas 102 of adjacent aggregate wiring boards 100 are connected to each other. The aggregate wiring boards 100 are formed on the metal foil 22. A dummy member 101 having a laminated structure similar to that of the aggregate boards 100 is formed surrounding all the aggregate wiring boards 100 in the connected state. The wiring boards 10 and the aggregate wiring board 100 have the first surface (10*a*) facing the first support plate 3 side.

Figure 3F:
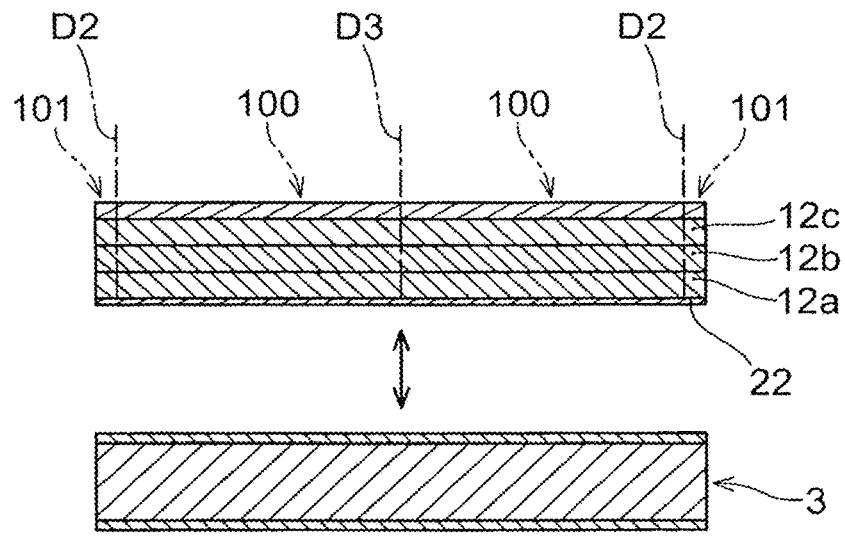
FIG. 3F is a cross-sectional view illustrating the example of the manufacturing method of the embodiment of the present invention.

As illustrated in FIG. 3F, the aggregate wiring boards 100 are separated from the first support plate 3. In the example of FIG. 3F, by peeling off the first support plate 3 from the metal foil 22, the first support plate 3 is separated from the aggregate wiring boards 100. For example, when a thermoplastic adhesive is used for the adhesive 21 (see FIG. 3E), the adhesive 21 is heated. In a state in which the adhesive 21 is softened by heating, the first support plate 3 and the aggregate wiring boards 100 are pulled apart. When a relatively soft adhesive having a weak adhesive force is used for the adhesive 21, the first support plate 3 may be separated from the aggregate wiring boards 100 simply by mechanically pulling the first support plate 3 and the aggregate boards 100 in opposite directions to each other. For example, by inserting a thin plate-like or needle-like jig or the like into the adhesive 21 exposed at an edge of the first support plate 3, a breaking point is formed in the adhesive. The aggregate boards 100 together with the metal foil 22 may be gradually peeled from the first support plate 3 from the breaking point toward an edge on an opposite side of the breaking point.

Further, in the example illustrated in FIGS. 3A-3E, the first support plate 3 and the metal foil 22 are bonded to each other only at an outer peripheral portion. Therefore, the first support plate 3 may be separated from the aggregate wiring boards 100 by cutting off a bonding portion due to the adhesive 21 in the outer peripheral portion. For example, the first support plate 3 can be separated from the aggregate boards 100 by cutting the margin region (3*c*) of the first support plate 3 and the dummy member 101 using a router or the like at a position of a cutting line (D1) (see FIG. 3E) on an inner peripheral side of the bonding portion.

After the separation of the first support plate 3, the metal foil 22 is removed, for example, by etching or the like. As described above, the metal foil 22 can contribute to the formation of the conductor layer (11*a*) (see FIG. 3B) that has a fine pitch pattern due to electrolytic plating and can contribute to the ease of the separation of the first support plate 3 from the aggregate wiring boards 100. In the manufacturing method of the embodiment, the first support plate 3 is separated before mounting the electronic component 2 (see FIG. 2). Therefore the metal foil 22 exposed by the removal of the first support plate 3 can be removed at this point. That is, etching for removing the metal foil 22 can be performed before mounting the electronic component 2. As compared to the case where the electronic component 2 is mounted on the first support plate 3 and thereafter the separation of the first support plate 3 and the removal of the metal foil 22 are performed, there is less concern about damage to the electronic component 2 due to etching. The metal foil 22 can be easily removed without requiring a protective member or the like for the electronic component 2.

Figure 3G:
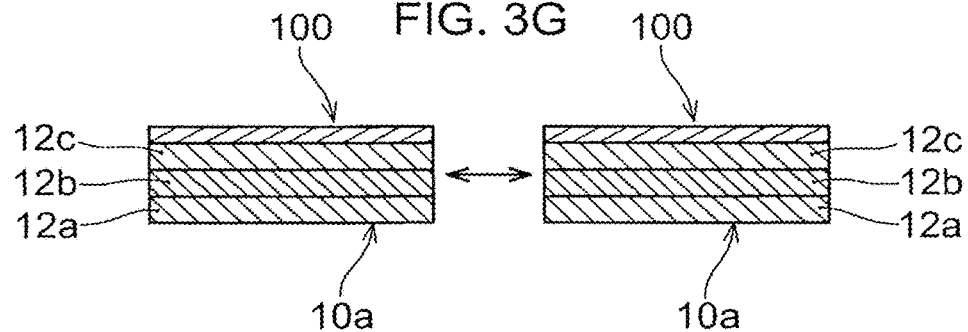
FIG. 3G is a cross-sectional view illustrating the example of the manufacturing method of the embodiment of the present invention.

As illustrated in FIG. 3G, the multiple aggregate wiring boards 100 in the connected state are divided into individual aggregate wiring boards 100. Further, the aggregate wiring boards 100 are separated from the dummy member 101 (see FIG. 3F), and the dummy member 101 is removed. The resin insulating layers (12*a*-12*c*) are cut by router processing, die processing, or the like at positions of edges of the aggregate wiring boards 100, for example, at positions indicated by cutting lines (D2, D3) (see FIG. 3F). As a result, as illustrated in FIG. 3G, the aggregate wiring boards 100 are divided into individual aggregate wiring boards 100. The first surface (10*a*) of each of the aggregate wiring boards 100 is exposed by the removal of the metal foil 22.

Here, the position indicated by the cutting line (D1) (see FIG. 3E) and the position indicated by the cutting line (D2)

(see FIG. 3F) may be substantially the same. That is, as described above, in the case where the separation of the first support plate 3 from the aggregate wiring boards 100 is performed by cutting off the bonding portion, it is also possible that, by cutting the resin insulating layers (12a-12c) and the first support plate 3 at the position of the cutting line (D1), together with the separation of the first support plate 3, the dummy member 101 is removed. Further, it is also possible that the cutting at the position of the cutting line (D3) (see FIG. 3F) is performed in the same process as the cutting at the position of the cutting line (D1). The separation of the first support plate 3 and the division of the aggregate wiring boards 100 into individual aggregate wiring boards 100 can be performed substantially simultaneously. The electronic component attached wiring board 1 can be efficiently manufactured.

Figure 3H:
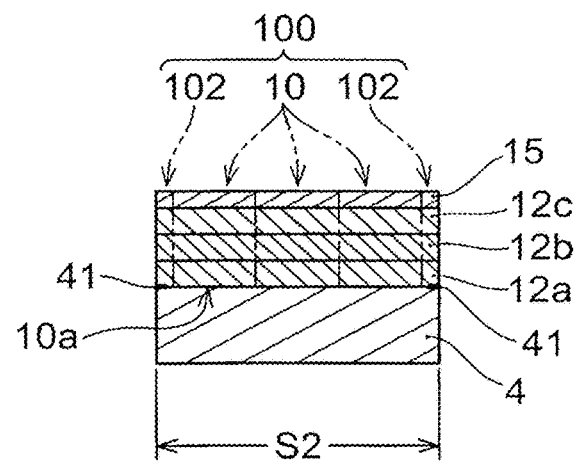
FIG. 3H is a cross-sectional view illustrating the example of the manufacturing method of the embodiment of the present invention.

As illustrated in FIG. 3H, the second support plate 4 is bonded to the surface of each of the aggregate wiring boards 100 that have been divided into individual aggregate wiring boards 100. In the example of FIG. 3H, the second support plate 4 is bonded to the first surface (10a) of the aggregate wiring board 100 by an adhesive 41. For example, the adhesive 41 is applied by printing or the like in a peripheral edge portion of a surface (bonding surface) on one side of the second support plate 4. The aggregate wiring board 100 is overlaid on the bonding surface of the second support plate 4. The adhesive 41 is cured by heating, ultraviolet irradiation, or room temperature storage for a predetermined time period, and, as illustrated in FIG. 3H, the second support plate 4 and the aggregate board 100 are bonded to each other by the adhesive 41 at their respective outer peripheral portions. It is also possible that the adhesive 41 is applied to the entire bonding surface of the second support plate 4 and/or the entire first surface (10a) of the aggregate wiring board 100, and the second support plate 4 and the aggregate wiring board 100 are bonded to each on their entire opposing surfaces. Since the second support plate 4 and the aggregate wiring board 100 are firmly bonded to each other, the electronic component 2 (see FIG. 2) can be more stably mounted.

The second support plate 4 has in a plan view the second size (S2) that is larger than the size (third size) of the wiring board 10 and smaller than the size (first size) of the first support plate 3. Preferably, a second support plate 4 having a size in a plan view equal to or larger than a size of the aggregate board 100 is used. For example, with respect to an aggregate wiring board 100 having a rectangular outer shape in a plan view, when a second support plate 4 having a rectangular outer shape in a plan view is used, preferably, a length of one of two orthogonal sides of the second support plate 4 is longer than a length of any one of two orthogonal sides of the aggregate wiring board 100. Preferably, a length of the other one of the two orthogonal sides of the second support plate 4 is longer than a length of the other one of the two orthogonal sides of the aggregate wiring board 100. All the wiring boards 10 are supported on the second support plate 4 over the entire surface. The electronic components 2 can be respectively mounted on all the wiring boards 10 with good quality.

A material for the second support plate 4 is not particularly limited as long as the material is rigid enough to allow the electronic components 2 to be respectively stably mounted on the wiring boards 10 on the second support plate 4. For example, similar to the first support plate 3, a resin substrate, a metal plate formed of copper, a double-sided copper-clad laminated plate, or the like can be used as the second support plate 4. Further, the second support plate 4 can have any outer peripheral shape in a plan view. For example, the second support plate 4 has in a plan view a substantially similar or preferably substantially identical outer shape to the aggregate wiring board.

The adhesive 41 is not particularly limited as long as the adhesive 41 is capable of maintaining a bonding state between the second support plate 4 and the aggregate wiring board 100 without causing excessive misalignment or peeling between the second support plate 4 and the aggregate wiring board 100 during the mounting of the electronic components 2. An adhesive same as the adhesive 21 (see FIG. 3B) used for bonding the first support plate 3 and the metal foil 22 may be used for the adhesive 41. However, as the adhesive 41, it is preferable to use an adhesive having a property of being unlikely to remain on the bonding surface of the aggregate wiring board 100 after later-described separation of the second support plate 4 from the aggregate wiring board 100. That is, as the adhesive 41, it is preferable to use an adhesive that, although does not develop a strong adhesive force, has adequate adhesion to a surface and can be integrally peeled off from a bonding surface of a bonding object without easily breaking internally. Examples of such adhesives include fluorine-based resins, silicone-based resins, and the like.

Figure 3I:
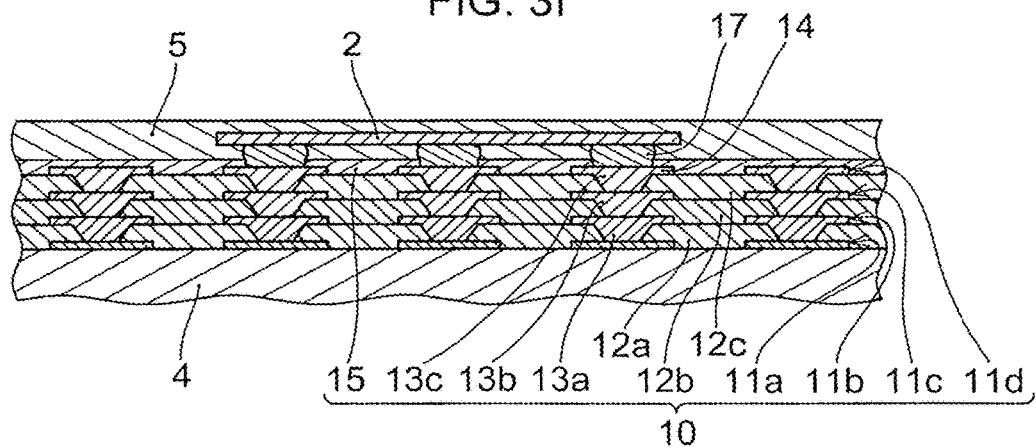
FIG. 3I is a cross-sectional view illustrating the example of the manufacturing method of the embodiment of the present invention.

As illustrated in FIG. 3I, an electronic component 2 is mounted on each wiring board 10 on the second support plate 4. In FIG. 3I, of the aggregate wiring board 100, only a portion around one wiring board 10 is illustrated by being enlarged in the surface direction. Further, the conductor layers (11a-11d) and the via conductors (13a-13c) are illustrated without being omitted. The electronic component 2 is connected by the bonding members 17 on the connection pads 14 in the conductor layer (11d) of the wiring board 10. The bonding members 17 are not particularly limited as long as the bonding members 17 allow the electronic component 2 and the connection pads 14 to be connected preferably with low electrical resistance. For example, solder and a conductive adhesive can be used for the bonding members 17. When solder is used, for example, solder bumps are formed on the electronic component 2 or on the connection pads 14, and solder reflow is performed after the electronic component 2 is mounted on the connection pads 14. When a conductive adhesive is used, the conductive adhesive may be cured by heating or the like after the conductive adhesive is applied to the connection pads 14 and the electronic component 2 is mounted on the connection pads 14. Methods for mounting the electronic component 2 are not limited to these methods. The electronic component 2 can be mounted using any suitable method. An electronic component 2 is mounted on each of the multiple wiring boards 10 in the aggregate wiring board 100.

Examples of the electronic components 2 include active components such as a bare chip, WLP or other integrated circuit devices, transistors or diodes, and the like. The electronic components 2 are not limited to these examples. For example, in addition to passive components such as inductors of a surface mount type or other forms, capacitors, resistors, and the like, any electronic component can be mounted on connection pads 14.

As illustrated in FIG. 3I, preferably, the sealing member 5 covering the electronic component 2 is formed on the electronic component 2 and the wiring board 10. For example, a resin material molded into a film-like shape is laminated on the wiring board 10 so as to cover the electronic component 2 and the solder resist layer 15. It is also possible that a paste-like or liquid resin material is applied on the electronic component 2 and the solder resist layer 15 by mask printing, discharging from a nozzle or the like. The sealing member 5 can be formed by heating the resin material at a predetermined curing temperature and allowing the resin material to be fully cured. An example of a material for the sealing member 5 is epoxy resin. The epoxy resin may contain an inorganic filler such as silica.

Figure 3J:
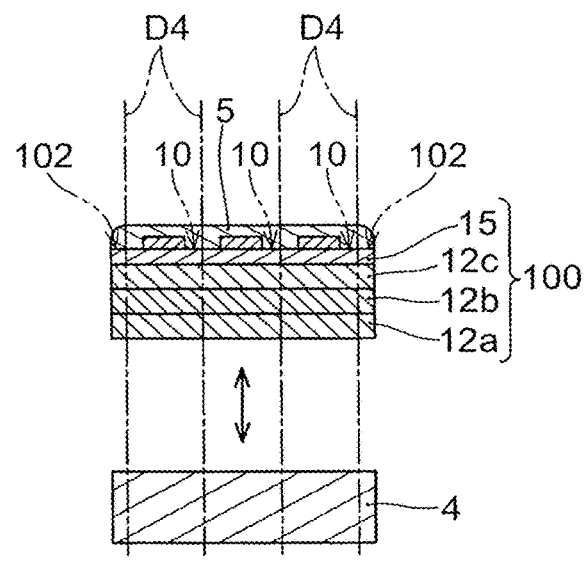
FIG. 3J is a cross-sectional view illustrating the example of the manufacturing method of the embodiment of the present invention.

As illustrated in FIG. 3J, the second support plate 4 is separated from the wiring boards 10. In FIG. 3J, the cross section of the entire aggregate wiring board 100 after the mounting of the electronic components 2 is illustrated at substantially the same magnifications in the thickness direction and the surface direction as in FIG. 3H. The separation of the second support plate 4, for example, can be performed in the same way as the separation of the first support plate 3 from the aggregate boards 100 (see FIG. 3F). That is, in a heated state, the second support plate 4 and the aggregate board 100 may be pulled apart; and in a non-heated state, the second support plate 4 and the aggregate board 100 may be peeled off from each other starting from a broking part of the adhesive 41 provided at an edge of the second support plate 4. Further, it is also possible that a bonding portion of the aggregate board 100 and the second support plate 4 in an outer peripheral portion is cut off.

Before or after the separation of the second support plate 4 from the wiring boards 10, the multiple wiring boards 10 in the aggregate wiring board 100 are divided into individual wiring boards 10. Further, the wiring boards 10 and the dummy area 102 of the aggregate wiring board 100 are separated, and the dummy area 102 is removed. When the division of the wiring boards 10 into individual wiring boards 10 is performed after the separation of the second support plate 4, for example, by router processing or the like at positions of cutting lines (D4) illustrated in FIG. 3J, that is, at edges of the multiple wiring boards 10, the aggregate wiring board 100 is cut together with the sealing member 5.

When the division of the wiring boards 10 into individual wiring boards 10 is performed before the separation of the second support plate 4, together with the aggregate wiring board 100 and the sealing member 5, the second support plate 4 is also cut at the positions of the cutting lines (D4). Thereafter, using the same method as that for separating the second support plate 4, the second support plate 4 is separated from the wiring boards 10 that have been divided into individual wiring boards 10.

Figure 3K:
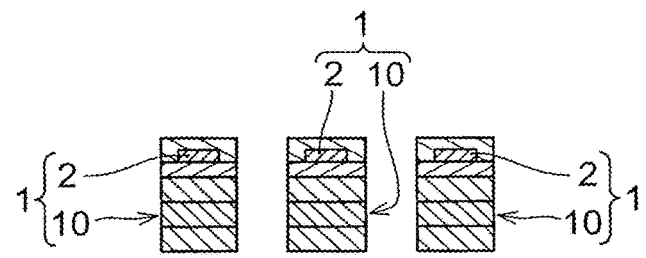
FIG. 3K is a cross-sectional view illustrating the example of the manufacturing method of the embodiment of the present invention.

As a result, as illustrated in FIG. 3K, the individual multiple wiring boards 10 each having an electronic component are obtained. Through the above processes, the electronic component attached wiring board 1 illustrated in FIG. 2 is completed.

The method for manufacturing the electronic component attached wiring board of the embodiment is not limited to the method described with reference to FIGS. 3A-3K. The individual processes may be performed with various modifications with respect to the above description.

Figure 4:
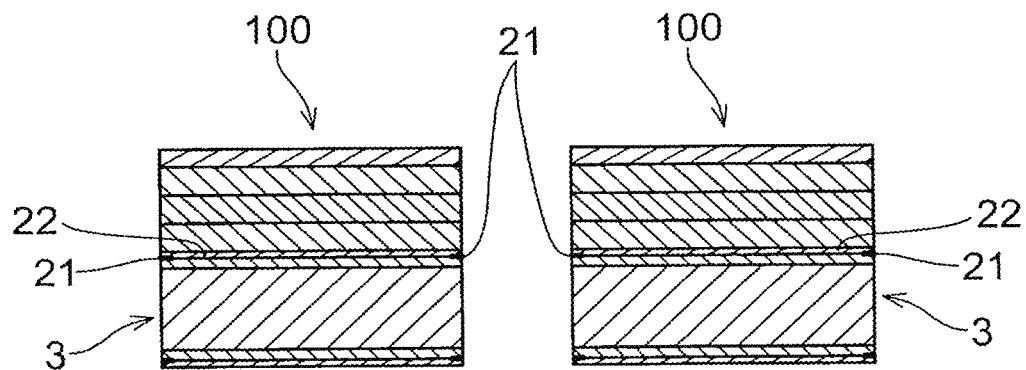
FIG. 4 is a cross-sectional view illustrating another example of the manufacturing method of the embodiment of the present invention.

For example, as illustrated in FIG. 4, before the separation of the first support plate 3 from the aggregate wiring boards 100, the aggregate wiring boards 100 may be divided into individual aggregate wiring boards 100. In this case, the first support plate 3 is also cut according to the division of the aggregate wiring boards 100 into individual aggregate wiring boards 100. The cut individual pieces of the first support plate 3 are separated from the aggregate wiring boards 100 using the same method as that described with reference to FIG. 3F.

As illustrated in FIG. 4, when the aggregate wiring boards 100 are divided into individual aggregate wiring boards 100, when the metal foil 22 and the first support plate 3 are bonded to each other only at an outer peripheral portion and are not bonded to each other at a central portion (see FIG. 3B), during the division of the aggregate wiring boards 100 into individual aggregate wiring boards 100, the aggregate wiring boards 100 in the connected state may deflect up and down. Further, when the first support plate 3 is bonded to the metal foil 22 only in the margin region (3c) (see FIG. 3E), for example, even at edges along the cutting lines (D2) (see FIG. 3F), the aggregate wiring boards 100 may deflect away from the first support plate 3 during the division of the aggregate wiring boards 100 into individual aggregate wiring boards 100. It is likely difficult to stably divide the aggregate wiring boards 100 in the connected state at accurate positions.

In the example illustrated in FIG. 4, the first support plate 3 and the metal foil 22 are bonded to each other by the adhesive 21 along outer peripheries of the aggregate wiring boards 100. Even when the aggregate wiring boards 100 are divided into individual aggregate wiring boards 100 before the separation of the first support plate 3, the aggregate wiring boards 100 can be stably divided into individual aggregate wiring boards 100 at accurate positions.

Figure 5:
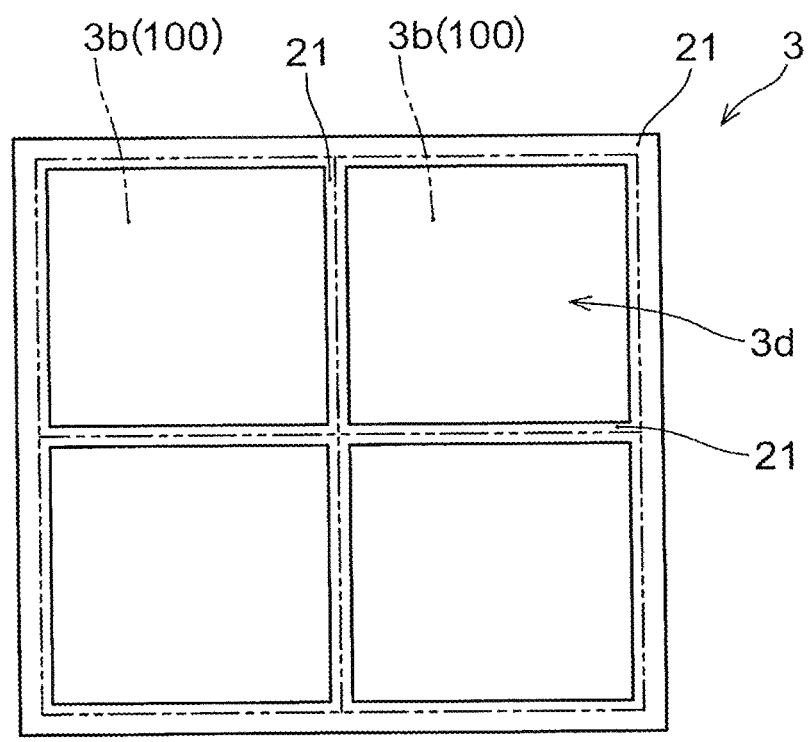
FIG. 5 is a plan view illustrating the other example of the manufacturing method of the embodiment of the present invention.

FIG. 5 illustrates an example of an application pattern of the adhesive 21 supplied on the surface (3d) of the first support plate 3 in the case where the first support plate 3 and the metal foil 22 are bonded to each other as illustrated in FIG. 4. As illustrated in FIG. 5, the adhesive 21 can be supplied to a portion that extends along edges of the formation regions (3b) for the aggregate wiring boards 100 on the first support plate 3 and has a predetermined width straddling each of the edges. By supplying the adhesive 21 on the first support plate 3 in this way and bonding the metal foil 22 by the adhesive 21, even before the separation of the first support plate 3, the aggregate wiring boards 100 can be stably divided into individual aggregate wiring boards 100 at accurate positions.

Figure 6A:
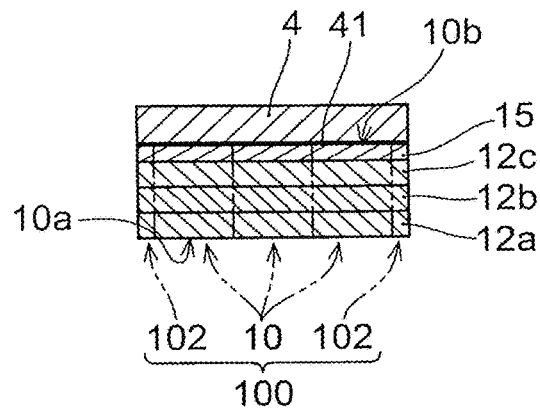
FIG. 6A is a cross-sectional view illustrating the other example of the manufacturing method of the embodiment of the present invention.

Different from the example illustrated in FIG. 3H, it is also possible that, as illustrated in FIG. 6A, the second support plate 4 is bonded to the second surface (10b) on an opposite side of the first surface (10a) of the aggregate wiring board 100. That is, it is also possible that the second support plate 4 is bonded to a surface on an opposite side of the surface exposed by the removal of the first support plate 3 and the metal foil 22. In the example of FIG. 6A, the second support plate 4 is bonded by an adhesive 41 on the solder resist layer 15 that foul's the second surface (10b) of the aggregate wiring board 100. The adhesive 41 is provided on the entire surface of the solder resist 15.

In the case where the second support plate 4 is bonded to the second surface (10b) of the aggregate wiring board 100 as illustrated in FIG. 6A, the electronic components may be mounted on the first surface (10a) side of the aggregate wiring board 100.

Figure 6B:
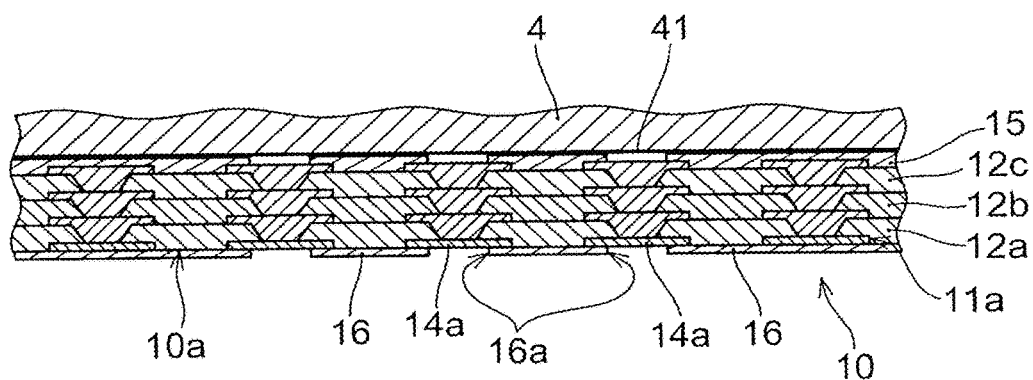
FIG. 6B is a cross-sectional view illustrating the other example of the manufacturing method of the embodiment of the present invention.

Preferably, as illustrated in FIG. 6B, a solder resist layer 16 is formed on the first surface (10a) of the aggregate board 100 exposed by the removal of the metal foil 22 (see FIG. 3F). The solder resist layer 16 can be formed using the same method as that described above for forming the solder resist layer 15. Openings (16a) that respectively expose connection pads (14a) in the conductor layer (11a) are formed at predetermined positions in the solder resist layer 16. In FIG. 6B and later-described FIG. 6C, similar to FIG. 3I, of the aggregate wiring board 100, only a portion around one wiring board 10 is illustrated by being enlarged in the surface direction.

Figure 6C:
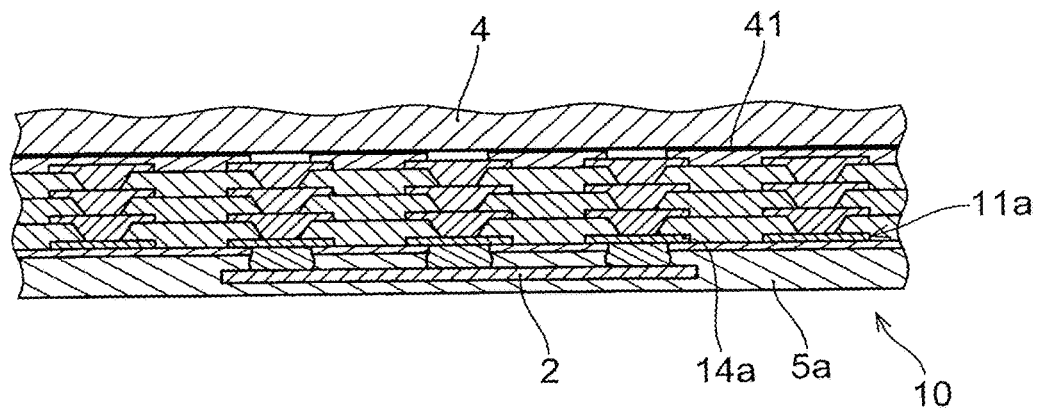
FIG. 6C is a cross-sectional view illustrating the other example of the manufacturing method of the embodiment of the present invention.

As illustrated in FIG. 6C, an electronic component 2 is mounted on the connection pads (14a), and a sealing member (5a) covering the electronic component 2 is foil led. The mounting of the electronic component 2 and the formation of the sealing member (5a) can be performed using the same methods as those described above with reference to FIG. 3I for the mounting of an electronic component 2 on the connection pads 14 and the formation of the sealing member 5. In the method illustrated in FIGS. 6A-6C, the electronic component 2 is mounted on the connection pads (14a) in the conductor layer (11a). Since the conductor layer (11a) can be formed without etching as described above, a conductor pattern formed with a fine pitch can be obtained. An electronic component having terminals (not illustrated in the drawings) arrayed at a narrow pitch can be mounted. After the mounting of the electronic components 2, using the same methods as those described above with reference to FIGS. 3J and 3K, the second support plate 4 can be separated, and the wiring boards 10 can be divided into individual wiring boards 10. An electronic component attached wiring board having an electronic component mounted on one surface of a wiring board 10 can be obtained.

In addition to the modified embodiment described with reference to FIGS. 4-6C, the processes of the manufacturing method of the embodiment may also be performed with various modifications. For example, the removal of the metal foil 22 (see FIG. 3F) may also be performed after the process in which the aggregate wiring boards 100 in the connected state are divided into individual aggregate wiring boards 100 (see FIG. 3G) Further, as described above, in the case where the second support plate 4 is bonded to the second surface (10b) of the aggregate wiring board 100, it is also possible that the metal foil 22 is removed after the bonding of the second support plate 4. The second surface (10b) side of the aggregate wiring board 100 can be protected by the second support plate 4 from an etching solution during the removal of the metal foil 22.

With respect to a method for manufacturing an electronic component attached wiring board according to an embodiment of the present invention, it is possible that a process other than the processes described above is added, and it is also possible that some of the processes described above are omitted.

In Japanese Patent Laid-Open Publication No. 2012-209580, one wiring substrate is formed on one support, and one semiconductor device including the wiring substrate is manufactured. Manufacturing efficiency of the wiring substrate and the semiconductor device is likely to be low. Further, when mounting of an electronic component such as a semiconductor element is performed after the support is removed, mounting failure such as misalignment of the electronic component is likely to occur due to warpage or deflection of the wiring substrate that is mainly formed of a thin resin layer or a metal layer. On the other hand, when an electronic component is mounted on the wiring substrate on the support, due to a large support used for a purpose of improving the manufacturing efficiency of the wiring substrate, large-sized equipment is likely to be required in the mounting process. Further, mounting the electronic component with high positional accuracy is likely to be difficult. Mounting yield of the electronic component and reliability of connection between the electronic component and the wiring substrate are likely to be low.

A method for manufacturing an electronic component attached wiring board according to an embodiment of the present invention is a method for manufacturing an electronic component attached wiring board that has a wiring board and an electronic component mounted on the wiring board, the wiring board having connection pads for connecting to the electronic component. The method includes: preparing a first support plate having a first size larger in a plan view than that of the wiring board; forming multiple aggregate wiring boards in a connected state by forming a conductor layer and an insulating layer on one surface of the first support plate, the aggregate wiring boards being each formed by forming multiple wiring boards side by side; separating the first support plate from the aggregate wiring boards; dividing the multiple aggregate wiring boards in the connected state into individual aggregate wiring boards; bonding a second support plate to a surface of each of the aggregate wiring boards, the second support plate having in a plan view a second size that is larger than that of each of the wiring boards and smaller than the first size; mounting an electronic component on each of the multiple wiring boards in each of the aggregate wiring boards; dividing the multiple wiring boards in each of the aggregate wiring boards into individual wiring boards; and separating the second support plate from the wiring boards. Mounting of the electronic components on the multiple wiring boards is performed on the second support plate.

According to an embodiment of the present invention, formation of a wiring board and mounting of an electronic component can be performed with respect to multiple wiring boards on support plates having sizes suitable for respective processes. A mounting yield of the electronic component is likely to be high and quality of connection between the wiring board and the electronic component is also likely to be high. A highly reliable electronic component attached wiring board can be efficiently manufactured.

Obviously, numerous modifications and variations of the present invention are possible in light of the above teachings. It is therefore to be understood that within the scope of the appended claims, the invention may be practiced otherwise than as specifically described herein.

The invention claimed is:
1. A method for manufacturing an electronic component attached wiring board, comprising:
preparing a first support plate;
forming a plurality of aggregate wiring boards on a surface of the first support plate such that the aggregate wiring boards each including a plurality of wiring boards side by side are formed in a connected state on the surface of the first support plate;
separating the first support plate from the plurality of aggregate wiring boards in the connected state;
dividing the plurality of aggregate wiring boards in the connected state into a plurality of individual aggregate wiring boards each including the plurality of wiring boards;
bonding a second support plate to a surface of each of the individual aggregate wiring boards such that each of the individual aggregate wiring boards is bonded to a surface of the second support plate;
mounting a plurality of electronic components on the wiring boards in each of the individual aggregate wiring boards on the second support plate respectively such that each of the wiring boards in each of the individual aggregate wiring boards has a respective one of the electronic components mounted thereon;
dividing the plurality of wiring boards in each of the individual aggregate wiring boards into a plurality of individual wiring boards; and
separating the second support plate from the plurality of individual wiring boards, wherein the surface of the first support plate has a first size which is larger than a second size of the surface of the second support plate.

2. The method for manufacturing an electronic component attached wiring board according to claim 1, wherein the separating of the first support plate from the plurality of aggregate wiring boards in the connected state comprises separating the first support plate from the plurality of aggregate wiring boards in the connected state prior to the dividing of the plurality of aggregate wiring boards in the connected state.

3. The method for manufacturing an electronic component attached wiring board according to claim 2, further comprising:
forming on the plurality of aggregate wiring boards a solder resist layer having a plurality of opening portions such that the plurality of opening portions exposes a plurality of connection pads positioned to mount a respective one of the electronic components on a respective one of the wiring boards in each of the aggregate wiring boards,
wherein the mounting of the plurality of electronic components comprises mounting the plurality of electronic components on the wiring boards in each of the individual aggregate wiring boards on the second support plate respectively such that each of the wiring boards in each of the individual aggregate wiring boards has a respective one of the electronic components mounted to the plurality of connection pads thereon.

4. The method for manufacturing an electronic component attached wiring board according to claim 2, wherein the preparing of the first support plate comprises forming a metal foil on the surface of the first support plate, the forming of the aggregate wiring boards on the surface of the first support plate comprises forming the aggregate wiring boards on the metal foil formed on the surface of the first support plate such that the plurality of aggregate wiring boards each comprising the plurality of wiring boards side by side is formed in the connected state on the metal foil formed on the surface of the first support plate, and the separating of the first support plate from the plurality of aggregate wiring boards in the connected state comprises removing the metal foil from the plurality of aggregate wiring boards in the connected state.

5. The method for manufacturing an electronic component attached wiring board according to claim 4, wherein the forming of the metal foil on the surface of the first support plate comprises bonding the metal foil only to a peripheral portion of the surface of the first support plate, and the dividing of the plurality of aggregate wiring boards in the connected state into the plurality of individual aggregate wiring boards includes cutting off the peripheral portion of the surface of the first support plate to which the metal foil is bonded.

6. UM The method for manufacturing an electronic component attached wiring board according to claim 1, wherein the bonding of the second support plate to the surface of each of the individual aggregate wiring boards comprises bonding the second support plate to the surface of each of the individual aggregate wiring boards such that the plurality of individual aggregate wiring boards has the first support plate on first surfaces of the individual aggregate wiring boards one side and the second support plate on second surfaces of the individual aggregate wiring boards on the opposite side.

7. The method for manufacturing an electronic component attached wiring board according to claim 6, further comprising:
forming on the plurality of aggregate wiring boards a solder resist layer having a plurality of opening portions such that the plurality of opening portions exposes a plurality of connection pads positioned to mount a respective one of the electronic components on a respective one of the wiring boards in each of the aggregate wiring boards,
wherein the mounting of the plurality of electronic components comprises mounting the plurality of electronic components on the wiring boards in each of the individual aggregate wiring boards on the second support plate respectively such that each of the wiring boards in each of the individual aggregate wiring boards has a respective one of the electronic components mounted to the plurality of connection pads thereon.

8. The method for manufacturing an electronic component attached wiring board according to claim 6, wherein the preparing of the first support plate comprises forming a metal foil on the surface of the first support plate, the forming of the aggregate wiring boards on the surface of the first support plate comprises forming the aggregate wiring boards on the metal foil formed on the surface of the first support plate such that the plurality of aggregate wiring boards each comprising the plurality of wiring boards side by side is formed in the connected state on the metal foil formed on the surface of the first support plate, and the separating of the first support plate from the plurality of aggregate wiring boards in the connected state comprises removing the metal foil from the plurality of aggregate wiring boards in the connected state.

9. The method for manufacturing an electronic component attached wiring board according to claim 8, wherein the forming of the metal foil on the surface of the first support plate comprises bonding the metal foil only to a peripheral portion of the surface of the first support plate, and the dividing of the plurality of aggregate wiring boards in the connected state into the plurality of individual aggregate wiring boards includes cutting off the peripheral portion of the surface of the first support plate to which the metal foil is bonded.

10. UM The method for manufacturing an electronic component attached wiring board according to claim 1, further comprising:
forming on the plurality of aggregate wiring boards a solder resist layer having a plurality of opening portions such that the plurality of opening portions exposes a plurality of connection pads positioned to mount a respective one of the electronic components on a respective one of the wiring boards in each of the aggregate wiring boards,
wherein the mounting of the plurality of electronic components comprises mounting the plurality of electronic components on the wiring boards in each of the individual aggregate wiring boards on the second support plate respectively such that each of the wiring boards in each of the individual aggregate wiring boards has a respective one of the electronic components mounted to the plurality of connection pads thereon.

11. The method for manufacturing an electronic component attached wiring board according to claim 10, wherein the preparing of the first support plate comprises forming a metal foil on the surface of the first support plate, the forming of the aggregate wiring boards on the surface of the first support plate comprises forming the aggregate wiring boards on the metal foil formed on the surface of the first support plate such that the plurality of aggregate wiring boards each comprising the plurality of wiring boards side by side is formed in the connected state on the metal foil formed on the surface of the first support plate, and the separating of the first support plate from the plurality of aggregate wiring boards in the connected state comprises removing the metal foil from the plurality of aggregate wiring boards in the connected state.

12. The method for manufacturing an electronic component attached wiring board according to claim 11, wherein the forming of the metal foil on the surface of the first support plate comprises bonding the metal foil only to a peripheral portion of the surface of the first support plate, and the dividing of the plurality of aggregate wiring boards in the connected state into the plurality of individual aggregate wiring boards includes cutting off the peripheral portion of the surface of the first support plate to which the metal foil is bonded.

13. The method for manufacturing an electronic component attached wiring board according to claim 1, wherein the preparing of the first support plate comprises forming a metal foil on the surface of the first support plate, the forming of the aggregate wiring boards on the surface of the first support plate comprises forming the aggregate wiring boards on the metal foil formed on the surface of the first support plate such that the plurality of aggregate wiring boards each comprising the plurality of wiring boards side by side is formed in the connected state on the metal foil forming on the surface of the first support plate, and the separating of the first support plate from the plurality of aggregate wiring boards in the connected state comprises removing the metal foil from the plurality of aggregate wiring boards in the connected state.

14. UM The method for manufacturing an electronic component attached wiring board according to claim 13, wherein the forming of the metal foil on the surface of the first support plate comprises bonding the metal foil only to a peripheral portion of the surface of the first support plate, and the dividing of the plurality of aggregate wiring boards in the connected state into the plurality of individual aggregate wiring boards includes cutting off the peripheral portion of the surface of the first support plate to which the metal foil is bonded.

15. The method for manufacturing an electronic component attached wiring board according to claim 1, wherein the forming of the aggregate wiring boards comprises forming a laminate structure comprising a conductor layer and an insulating layer on the surface of the first support plate such that the plurality of aggregate wiring boards each including the plurality of wiring boards side by side is formed in the connected state on the surface of the first support plate.

16. The method for manufacturing an electronic component attached wiring board according to claim 15, wherein the separating of the first support plate from the plurality of aggregate wiring boards in the connected state comprises separating the first support plate from the plurality of aggregate wiring boards in the connected state prior to the dividing of the plurality of aggregate wiring boards in the connected state.

17. The method for manufacturing an electronic component attached wiring board according to claim 15, wherein the bonding of the second support plate to the surface of each of the individual aggregate wiring boards comprises bonding the second support plate to the surface of each of the individual aggregate wiring boards such that the plurality of individual aggregate wiring boards has the first support plate on first surfaces of the individual aggregate wiring boards one side and the second support plate on second surfaces of the individual aggregate wiring boards on the opposite side.

18. The method for manufacturing an electronic component attached wiring board according to claim 15, further comprising:
forming on the plurality of aggregate wiring boards a solder resist layer having a plurality of opening portions such that the plurality of opening portions exposes a plurality of connection pads positioned to mount a respective one of the electronic components on a respective one of the wiring boards in each of the aggregate wiring boards,
wherein the mounting of the plurality of electronic components comprises mounting the plurality of electronic components on the wiring boards in each of the individual aggregate wiring boards on the second support plate respectively such that each of the wiring boards in each of the individual aggregate wiring boards has a respective one of the electronic components mounted to the plurality of connection pads thereon.

19. The method for manufacturing an electronic component attached wiring board according to claim 15, wherein the preparing of the first support plate comprises forming a metal foil on the surface of the first support plate, the forming of the laminate structure on the surface of the first support plate comprises forming the laminate structure on the metal foil formed on the surface of the first support plate such that the plurality of aggregate wiring boards each comprising the plurality of wiring boards side by side is formed in the connected state on the metal foil formed on the surface of the first support plate, and the separating of the first support plate from the plurality of aggregate wiring boards in the connected state comprises removing the metal foil from the plurality of aggregate wiring boards in the connected state.

20. The method for manufacturing an electronic component attached wiring board according to claim 19, wherein the forming of the metal foil on the surface of the first support plate comprises bonding the metal foil only to a peripheral portion of the surface of the first support plate, and the dividing of the plurality of aggregate wiring boards in the connected state into the plurality of individual aggregate wiring boards includes cutting off the peripheral portion of the surface of the first support plate to which the metal foil is bonded.

* * * * *